United States Patent [19]
Patwardhan et al.

[11] Patent Number: 5,875,135
[45] Date of Patent: Feb. 23, 1999

[54] CHARACTERIZATION OF SELF TIME CIRCUIT

[75] Inventors: Shekhar Patwardhan, Santa Clara, Calif.; Tsafrir Israeli, Ein Arala; Eitan Rosen, Abirim, both of Israel

[73] Assignee: Intel Corporation, Santa Clara, Calif.

[21] Appl. No.: 730,890

[22] Filed: Oct. 18, 1996

Related U.S. Application Data

[63] Continuation-in-part of Ser. No. 580,173, Dec. 28, 1995, abandoned.

[51] Int. Cl.$^6$ .................................................. G11C 7/00
[52] U.S. Cl. .................... 365/194; 365/201; 365/230.08; 365/233
[58] Field of Search ................................. 365/207, 194, 365/233, 230.08, 201; 327/51, 52, 54

[56] References Cited

U.S. PATENT DOCUMENTS

| | | | |
|---|---|---|---|
| 4,926,387 | 5/1990 | Madland | 365/233 |
| 5,031,141 | 7/1991 | Guddat et al. | 365/49 |
| 5,442,799 | 8/1995 | Murakami et al. | 395/800 |
| 5,452,261 | 9/1995 | Chung et al. | 365/233 |
| 5,471,430 | 11/1995 | Sawada et al. | 365/222 |
| 5,559,745 | 9/1996 | Banik et al. | 365/201 |
| 5,633,828 | 5/1997 | McClure et al. | 365/201 |
| 5,729,160 | 3/1998 | Allan | 327/54 |
| 5,729,503 | 3/1998 | Manning | 365/233.5 |

*Primary Examiner*—David Nelms
*Assistant Examiner*—Hien Nguyen
*Attorney, Agent, or Firm*—Blakely, Sokoloff, Taylor & Zafman LLP

[57] ABSTRACT

Method and apparatus for characterization of a self timed circuit in an integrated circuit such as a sense amplifier in a memory. A software controlled testability feature is added to the integrated circuit permitting the sense amplifier to be enabled earlier in time following word line activation. In particular, a replacement timing circuit activated by a falling clock edge causes the sense amplifier enable signal to become clock frequency sensitive. The clock frequency is software controlled and parity checking provides a failure detection mechanism. A plurality of the integrated circuit are tested to provide the characterization.

7 Claims, 3 Drawing Sheets

CHARACTERIZATION OF SELF TIME CIRCUIT

This is a continuation-in-part of application Ser. No. 08/580,173, filed Dec. 28, 1995, now abandoned.

BACKGROUND OF THE INVENTION

1. Field of the Invention.

The invention relates to integrated circuits and more particularly critical timing in self timed circuits and other circuits where one event is intentionally delayed from a second event.

2. Prior Art.

Often in integrated circuits an event is initiated by the occurrence of another event and a predetermined delay. For instance, sense amplifiers in some static random-access memory (RAM) are enabled after a delay measured from activation of the word lines in the memory. In this case, it is desirable to have the sense amplifiers enabled as soon as possible after the word lines are activated in order to more quickly read data from the memory. However, the sense amplifiers cannot be activated too soon after the word lines become active since sufficient time must lapse for the bit lines to become sufficiently different in potential otherwise the sense amplifiers cannot sense the data. Numerous well-known self timed circuits are used for enabling the sense amplifier as well as other events in these memories. See, for example, U.S. Pat. Nos. 4,926,387 and 5,031,141.

Sometimes the self timed circuit, such as a sense amplifier, is not well characterized. While simulations are generally used to design the circuit such techniques do not account for all the factors determining the operating characteristics of the circuit. Thus, for example, the simulation may not accurately account for the influences from the surrounding circuitry in the final layout of the integrated circuit. Margins and guard bands are designed in to compensate for such things as process variations and inaccuracies in the simulation. After the integrated circuit is fabricated, if no failures occur in the self timed circuit, generally, there is no need to characterize the circuit. Consequently, it is not known how much of the margins or guard bands are really needed to assure a high yielding design. For instance, a simulation may show that a sense amplifier will operate when the differential between the bitlines is approximately 60 mvolts yet 160 mvolts may be used for selecting the time delay for activating the sense amplifier. This may be looked at as the price of ignorance. When these margins and guard bands are in a critical path in an integrated circuit they are particularly costly.

It is a difficult, if not impractical, task to characterize many circuits. In the case of the sense amplifier for one, there is no direct access to this circuit that would permit testing. Direct access by probing changes the characteristics and prevent an accurate evaluation.

A method and/or apparatus for easily and accurately characterizing a circuit in an integrated circuit is needed. As will be seen, the present invention provides a method and apparatus for building in a test feature which permits the characterization of the self timed circuit.

SUMMARY OF THE INVENTION

A method for improving an integrated circuit which includes a self time circuit controlled by a timing signal. The occurrence of the timing signal is externally adjusted until a failure in the self time circuit is detected. In this manner, the self time circuit is characterized and, for example, mask changes can be made to provide a timing signal consistent with the characterization.

In one embodiment where a delay chain which activates the sense amplifier is triggered by the rising edge of a clock signal, a replacement timing circuit (RTC) is used which is triggered by the trailing edge of the clock signal. During a test mode the frequency of the clock signal is reduced causing the sense amplifiers to be activated sooner in time following the activation of the word lines. Thus, the delay between the activation of the word line and the enablement of the sense amplifier may be software controlled by a tester external to the integrated circuit. By testing a plurality of integrated circuits from different wafers, the sense amplifier is characterized and a more optimum delay may be selected.

Other aspects of the present invention will be apparent from the following detail description.

DETAILED DESCRIPTION OF THE PRESENT INVENTION

A method and apparatus for characterizing circuits, particularly self timed circuits in an integrated circuit, is described. In the following description numerous specific details are set forth, such as a specific self timed circuit, specific timing, etc., in order to provide a thorough understanding of the present invention. It will be apparent, however, to one skilled in the art that the present invention may be practiced without these specific details. In other instances, well-known circuits, design techniques, processes equipment, and testing methods are not set forth in detail in order that the present invention not be obscured.

Figure 6:
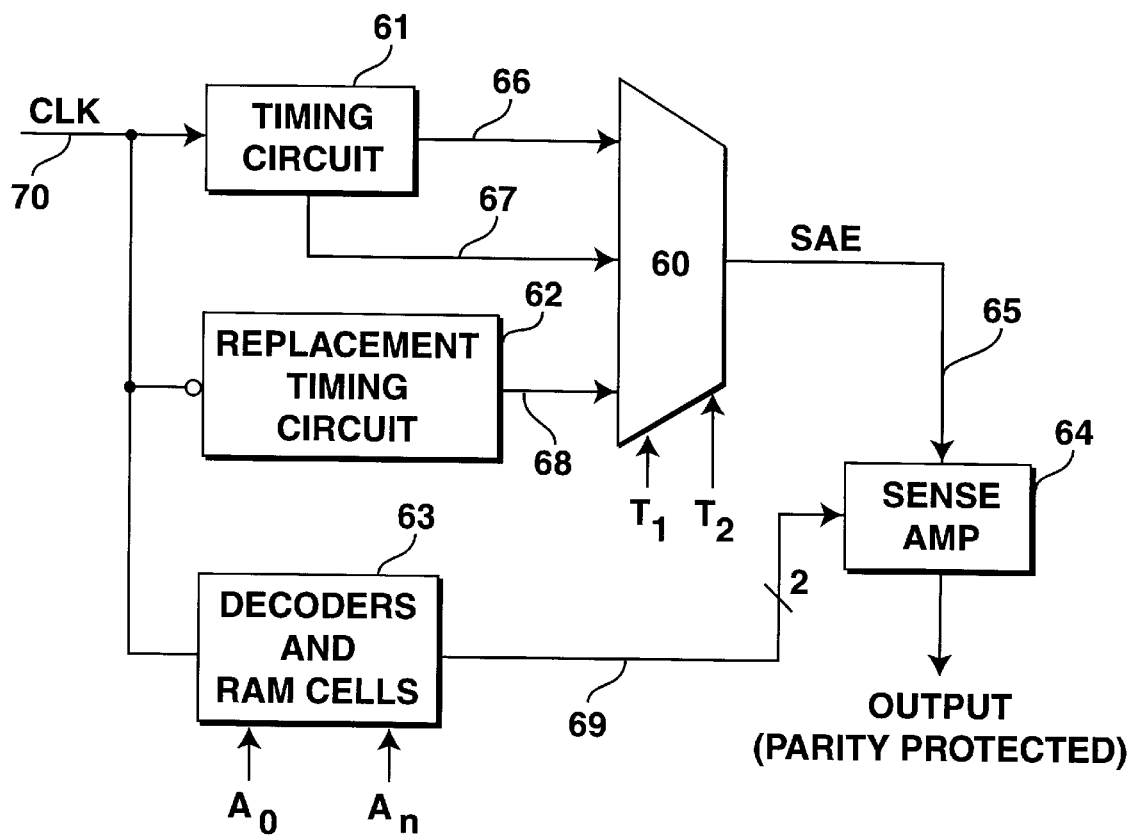
FIG. 6 is a block diagram illustrating one embodiment of the present invention.

Embodiment of FIG. 6

The present invention perhaps is best understood by referring first to a specific embodiment. In FIG. 6 decoders and random-access memory (RAM) cells are illustrated by block 63. The decoders are ordinary decoders which receive address bits $A_0$–$A_n$, decode these address bits and then provide signals for activating word lines in a memory array. The RAM cells may be ordinary bistable (flip-flop) cells such as are commonly used in static memories. As is common in static RAMs the cells are selectively coupled to sense amplifiers through complementary bitlines. The activation of a word line causes a cell to be coupled to a sense amplifier through a pair of bitlines during a read cycle. A sense amplifier 64 is shown in FIG. 6 with lines 69 representing the bitlines.

The sense amplifiers are typically bistable latch-like circuits with cross coupled nodes coupled to the pair of complementary bit lines. The amplifiers are activated by a sense enable (SAE) signal. Before the SAE signal is applied, the sense amplifier is in an unstable state. The differential potential on the bitlines causes the sense amplifier to assume one of its two stable states depending on whether a binary one or zero is being sensed.

For the sense amplifier to operate satisfactorily there must be some minimum differential voltage on the bitlines before the sense amplifier is enabled by the SAE signal. If the sense amplifier is activated before this minimum voltage is present, the amplifier may assume a stable state inconsistent with the data on the bitlines.

Figure 3:
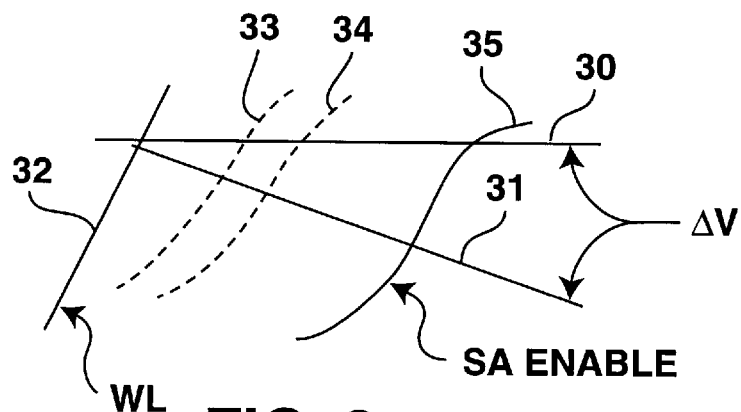
FIG. 3 is a graph showing the timing between the activation of a word line in a memory array and the enablement of a sense amplifier in the array.

Referring to FIG. 3 line 32 represents the rise in potential on a word line in the memory array of a RAM. This rising potential couples a cell to a sense amplifier. The lines 30 and 31 represent the potential on the bitlines after the cell is coupled to the bitlines. Typically the bitlines are precharged before the word line is activated. Precharging for the embodiment under discussion occurs in a first half of a memory cycle as will be described. After a cell is coupled to the bitlines, one bitline drops in potential as shown by line 31 because it is coupled to the low side of the memory cell. The other bitline, since it is coupled to the high side of the memory cell, will remain charged as shown by line 30.

Assume for sake of discussion, that the memory cell is able to discharge a bitline at a rate of 20 mvolts per 0.1 nsec. Assume further that after simulation, and with the addition of safety margins, 160 mvolts is the differential voltage on the bitlines selected to assure a very high percentage of sense amplifiers fabricated in a particular integrated circuit will operate satisfactorily. Thus, if the SAE signal enables the amplifier 0.8 nsecs after the word enable line is sufficiently activated to coupled the cell to the sense amplifier, the differential voltage between the bitlines will be approximately 160 mvolts for the described example.

It is of course desirable to reduce this time (0.8 nsecs) since in some cases this time is in a critical path. For instance, in a cache memory the output of a plurality of sense amplifiers are used in the detection of a cache miss. It is desirable to detect a cache miss as soon as possible. On the other hand, it is desirable to select a long enough delay between when the word line is activated and when the sense amplifier is enabled to assure that a very high percentage of the sense amplifiers will be able to faithfully detect data on the bitlines. As mentioned in the prior art section, once a delay is selected and assuming a high percentage of the amplifiers operate satisfactorily, the delay is generally not reevaluated since there is no practical way to accurately characterize the sense amplifier once it is in the integrated circuit.

Many memories provide cells for storing parity bits. In the embodiment of the present invention under discussion, parity bits are stored in the memory array allowing the integrity of the data read from the array to be checked. As will be discussed, these parity bits are used in the present invention to verify the operation of the sense amplifier. If a sense amplifier fails to operate properly parity provides an indication of the failure.

In the prior art a timing circuit is used to provide a delay between activation of the word lines and the enablement of the sense amplifier. For example, a clock signal used to activate the decoders and word lines is also coupled to a delay chain to provide a delayed signal (SAE signal).

In FIG. 6 a timing circuit 61 is used which may be similar to those used in the prior art with modification that will be discussed in conjunction with FIG. 2 to provide the SAE signal for the normal operation (i.e., non-test mode operation) of the memory. The timing circuit 61 receives a clock signal on line 70 and provides a delayed signal on line 66 which is coupled to a multiplexer 60. Depending on the states of the test select signals T1 and T2, the signal on line 66 is coupled to line 65 and provides the enable signal for the sense amplifier. During normal memory operation, the sense amplifier is activated by the timing signal from the output of the timing circuit 61 which is coupled through the multiplexer 60.

Figure 7:
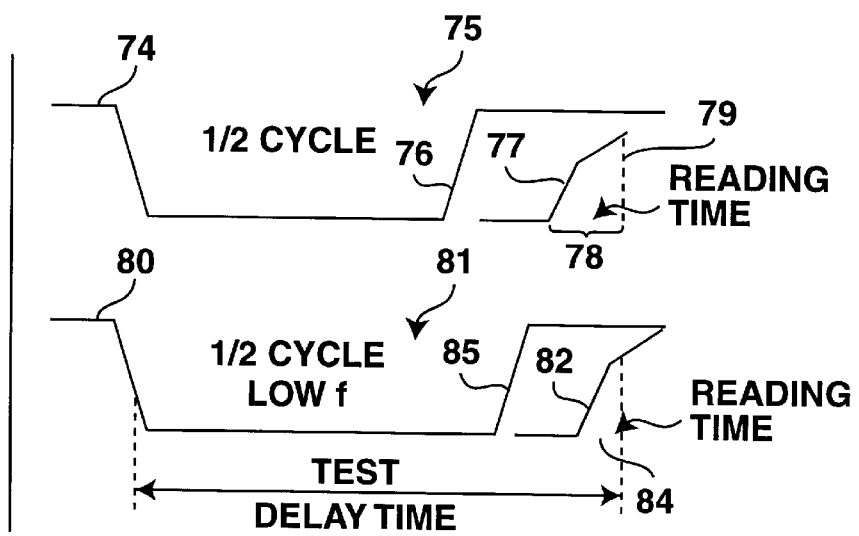
FIG. 7 shows two waveforms used to describe the operation of the circuit of FIG. 6.

Referring to FIG. 7 the waveform 74 represents the clock signal for each memory cycle on line 70 during normal memory operation. During the first half 75 of a memory cycle precharging occurs. At the end of this period as indicated by the rising edge 76, the decoders 63 are activated. The decoders 63 decode the address signal and after the decoding, a word line is activated. The word line activation is shown by line 77 in FIG. 7. Note that the delay for the decoding is shown by the difference in time between lines 76 and 77. The activation of the sense amplifier is shown by the line 79. The Reading Time represents the time for the bitlines to become differentially charged and as mentioned for the example under discussion, time 78 is 160 nsecs.

With the improvement of the present invention, a replacement timing circuit (RTC) 62 is used. This circuit provides a delay equal to the delay provided by timing circuit 61 plus a delay equal to one-half the normal memory cycle. However, unlike circuit 61, RTC 62 is triggered by the falling edge of the clock signal on line 70. The output of the RTC 62, line 68, is coupled to the sense amplifier enable line 65 through the multiplexer 60 when the signal T1 is high (i.e., during one of the test modes).

To characterize the sense amplifier 61, T1 is high causing the multiplexer 60 to select line 68 (not lines 66 or 67). The frequency of clock signal on line 70 which is externally applied is reduced as shown by waveform 80 of FIG. 7. During the first half 81 of this slower memory read cycle, precharging occurs as was the case for the normal operation described in conjunction with waveform 74. On the rising edge 85 of the clock signal, the decoders are activated and the address is decoded. Then after this decoding, a word line is selected as indicated by the line 82. Note that the time between lines 85 and 82 is equal to the time between lines 76 and 77 since the decoders are activated by the rising edge of a clock signal independent of the frequency of the clock. However, since the sense amplifier is timed from the falling edge of the clock signal during this test mode the sense amplifier will be activated sooner after the word lines are activated. That is, the Reading Time 84 is shorter than Reading Time 78. The shortened reading times cause the sense amplifier to eventually fail as it is reduced. Thus, to characterize the sense amplifier, the frequency is reduced in steps until a parity error is detected indicating that one or more sense amplifiers enabled by line 65 has failed. In this way the minimum time between the activation of the word line and the enablement of the sense amplifier can be determined for a particular sense amplifier.

Figure 4:
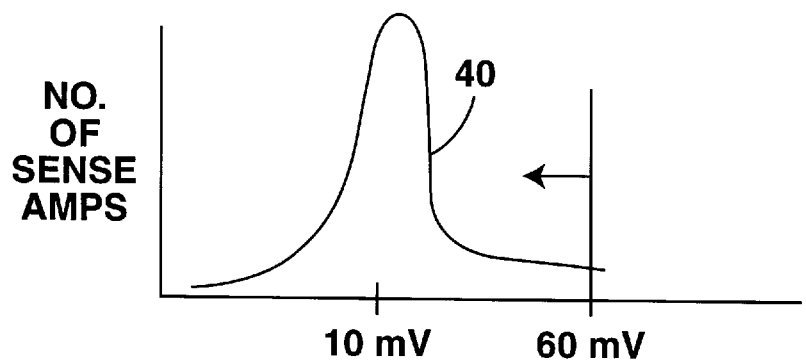
FIG. 4 is a graph illustrating numbers of sense amplifiers versus minimum differential voltages at which the sense amplifiers successfully operate.
Figure 5:
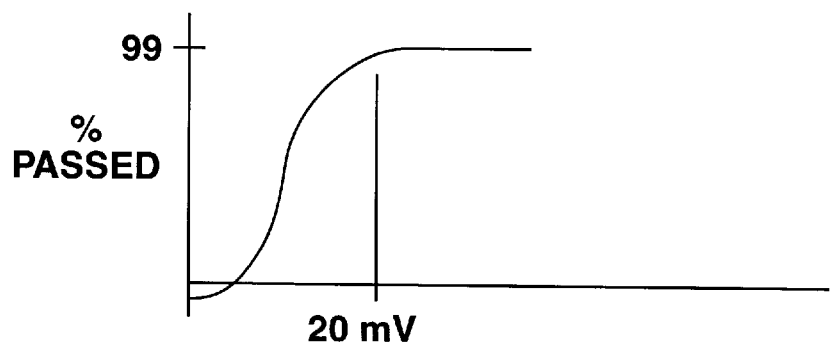
FIG. 5 is a graph illustrating the percent of sense amplifiers which operate successfully versus differential voltage at the input to the sense amplifiers.

In practice many (e.g., 100) integrated circuits from different wafers and from different processing lots are tested to provide an accurate characterization of the sense amplifier. This is shown in FIG. 4 where the reading time has been converted to a differential voltage by assuming a decay rate for a bitline coupled to a memory cell (e.g., 20 mvolts/0.1 nsecs). The bell shape curve 40 with a peak around 10 mvolts. As can be seen from FIG. 4, if 20 mvolts is selected as the differential voltage most amplifiers will operate satisfactorily. FIG. 5 illustrates that at 20 mvolts over 99% of amplifiers will pass for the example under discussion.

If sense amplifiers are enabled when the differential voltage is 60 mvolts, a time reduction of 0.5 nsecs is achieved for the given example. This is shown by line 34 of FIG. 3. This can be a significant gain in a critical path. It may, however, be unproductive to take advantage of this entire gain if some other critical path prevents realization of the benefit. In such a case it may be desirable to save less time in the SAE signal in favor of a higher yield.

Figure 2:
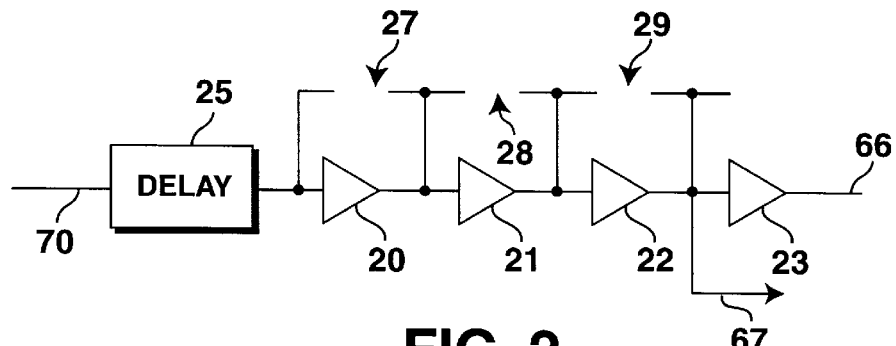
FIG. 2 is a circuit diagram of a timing chain used to describe the manner in which timing may be adjusted following the characterization of a circuit.

Referring now to FIG. 2, the timing circuit 61 of FIG. 6 is represented by delay 25 and inverters 20, 21, 22 and 23. Each of the inverters inherently provides a delay. Assume for sake of discussion, that after characterizing the sense amplifier it is determined that the delays provided by inverters 20, 21 and 22 may be eliminated. Then a mask change may be made to shunt out inverters 20, 21 and 22 by providing, for example, contacts at 27, 28 and 29. Metal contacts can be added in many integrated circuits with a minimum of mask changes to provide shunts to the inverters. Other techniques known in the art may be used to shunt the inverters or otherwise eliminate the delays associated with the inverters.

In the currently described embodiment, the inverters are not removed from the circuit since it is desired to make as few changes as possible to the integrated circuit. This not only avoids more mask changes, but prevents the circuit from being altered in a way that changes the operation of the sense amplifier. Even the removal of the inverters can change, for instance, couplings that affect the operation of the sense amplifier and thereby change its characterization. Thus, to this end lines needed to facilitate shunting of inverters may be incorporated into the original design so that the shunting can thereafter occur with a minimum of circuit changes.

Testing of Production Circuits

Generally, probe testing or other testing is used to verify the operation of memories. This testing includes the exercising of the sense amplifiers to see if they satisfactorily sense data from the bitlines. Unfortunately, some sense amplifiers pass this initial testing and subsequently fail to operate. Some of these amplifiers may have had only marginally acceptable performance when but yet passed the probe test. For instance, an amplifier may operate satisfactorily at the temperature at which the test was conducted but fail later in the field when operated at a higher temperature.

One aspect of the present invention is to provide a test which assures that the sense amplifiers operate with some margin of safety.

Referring to FIG. 6, when T2 is high, line 67 is selected by the multiplexer 60 and consequently, the sense amplifier enable signal is derived from line 67 not from lines 66 or 68. The signal on line 67 is a timing signal from the timing circuit 61 but one that occurs sooner in time than the signal on line 66. This is shown by line 33 of FIG. 3, that is, the sense amplifier is enabled even sooner in time than when compared to line 34. This reduces the reading time (e.g., by 10 nsec) and by so doing some of the marginally operating sense amplifiers will fail. This permits the identification of sense amplifiers which are only marginally satisfactorily with a simple test.

Referring to FIG. 2 line 67 is shown providing the enable signal used for this test. Note that by coupling line 67 between the inverters 22 and 23 the delay associated with inverter 23 is eliminated during the test.

This test, as can be appreciated, can be used independently of the characterization of the sense amplifier and mask change to the timing circuit discussed above.

Method of the Present Invention

While the present invention has been described in connection with the characterization of a sense amplifier, it can be used with other self timed circuits, such as those used in a read-only-memory, programmable logic array, or in connection with hold times, reset times and others. The method is described in a broader context in FIG. 1.

Step 10 illustrates the incorporation of bypassable timing elements in a timing chain. For instance, the inverters of FIG. 2 are bypassable elements which are incorporated in a timing chain of the timing circuit 61 of FIG. 6.

Next, as shown by step 11, a mechanism is provided for adjusting the timing and for detecting failures or otherwise measuring performance. As described for the sense amplifier the adjusting of the timing is done by using lower frequency clock signals which activate the RTC with a trailing edge of the clock signal as opposed to the leading edge used for the timing circuit 61. Additionally, for the sense amplifier example, parity is available in the memory and is used to detect sense amplifier failures.

Step 12 is the characterization of the timed circuit in quantity. Many sense amplifiers (100) are tested to characterize the sense amplifier in the example discussed above. This is done since the characteristics of one sense amplifier may vary from that of another due to ordinary process variations.

Figure 1:
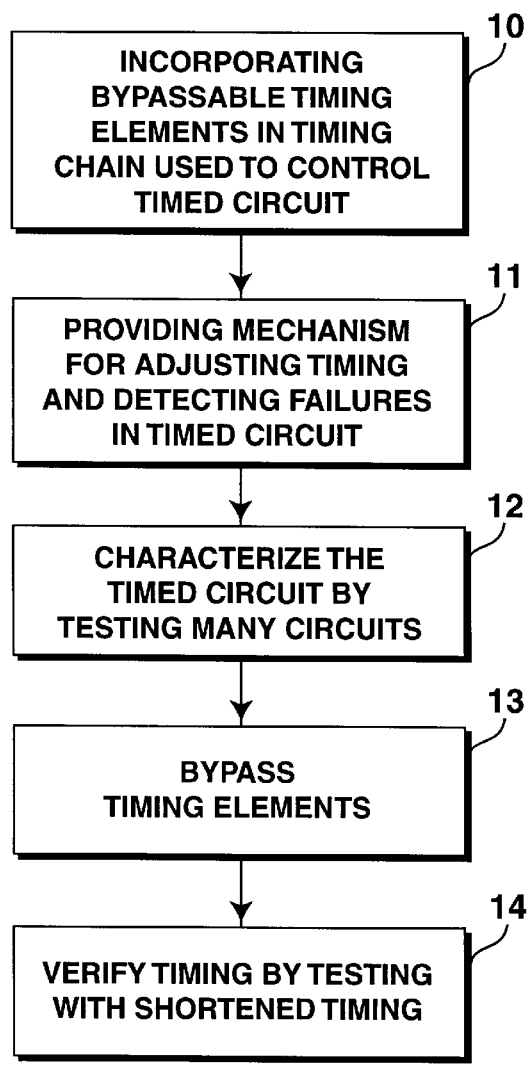
FIG. 1 illustrates a plurality of steps used to implement the present invention.

The next step, step 13 of FIG. 1, comprises the bypassing of timing elements. For the embodiment described above this is carried out by the shunting of the inverter shown in FIG. 2. This can be done with a mask change or with programmable devices such as EPROMs, fuses, antifuses or the like.

The final step, step 14 of FIG. 1, is the verification of the timing with a "hard" test. This is provided in the above example by shortening the timing to weed out marginally operating amplifiers.

Thus, a method and apparatus has been described which permits the characterization of self timed circuits and for providing increased performance following the characterization.

We claim:

1. A method for improving the performance of a circuit incorporated in an integrated circuit comprising:

providing a plurality of bypassable timing elements coupled to the circuit, such that the performance of the circuit is predicted to improve as one or more of the timing elements is bypassed;

testing the circuit in a manner which simulates selectively bypassing the elements;

determining from the testing the number of elements that should be bypassed to improved the performance of the circuits; and bypassing the number of elements determined from the preceding step.

2. The method defined by claim 1 wherein a plurality of integrated circuits incorporating the circuit are subjected to the testing in order to make the determination on the number of elements that should be bypassed.

3. The method defined by claim 1 wherein the step of bypassing the elements comprises the making of a mask change to at least one mask used in the fabrication of the integrated circuit.

4. The method defined by claim 1 including the additional step of verifying the performance of the circuit after the elements have been bypassed.

5. A method for characterizing a memory circuit such that the time between the enablement of a word line and the enablement of a sense amplifier may be reduced comprising:

provniding a plurality of bypassable delay elements coupled to the sense amplifier, such that as the elements are bypassed the time between the enablement of the word line and the sense amplifier is reduced;

providing a timing circuit which is enabled in a test mode and which controllably causes the time between the enablement of the word line and the enablement of the sense amplifier to be reduced;

providing a mechanism for detecting sensing errors in the sense amplifier;

testing a plurality of the memory circuit so as to determine the number of the timing elements that should be bypassed to increase the performance of the memory circuit; and bypassing the number of elements determined from the preceding step.

6. The method defined by claim 5 wherein the frequency of a memory cycle for the memory circuit is reduced thereby causing the time between the enablement of the word line and the enablement of the sense amplifier to be reduced.

7. The method defined by claim 5 wherein a parity bit is used to detect the errors.

* * * * *